US009029881B2

(12) United States Patent
Preuschl

(10) Patent No.: US 9,029,881 B2
(45) Date of Patent: May 12, 2015

(54) LED MODULE

(71) Applicant: OSRAM GmbH, Munich (DE)

(72) Inventor: Thomas Preuschl, Sinzing (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 13/938,293

(22) Filed: Jul. 10, 2013

(65) Prior Publication Data

US 2014/0014978 A1  Jan. 16, 2014

(30) Foreign Application Priority Data

Jul. 10, 2012  (DE) .......................... 10 2012 212 024

(51) Int. Cl.
*H01L 29/18* (2006.01)
*H01L 33/08* (2010.01)
*F21K 99/00* (2010.01)
*F21V 23/06* (2006.01)
*H05B 33/08* (2006.01)
*F21Y 101/02* (2006.01)

(52) U.S. Cl.
CPC . *H01L 33/08* (2013.01); *F21K 9/00* (2013.01); *F21V 23/06* (2013.01); *F21Y 2101/02* (2013.01); *H05B 33/083* (2013.01)

(58) Field of Classification Search
CPC .................................. H01L 33/08; F21K 9/00
USPC ............................................................ 257/88
See application file for complete search history.

(56) References Cited

U.S. PATENT DOCUMENTS

| 7,775,682 B2* | 8/2010 | Zhou ......................... 362/249.06 |
| 2009/0128046 A1 | 5/2009 | Tsai |
| 2010/0002421 A1* | 1/2010 | Arnold, III .................... 362/183 |
| 2011/0169408 A1* | 7/2011 | Chen et al. ...................... 315/51 |
| 2011/0175548 A1* | 7/2011 | Nishimura et al. ........... 315/294 |
| 2014/0077709 A1* | 3/2014 | Zhang et al. .................. 315/188 |

FOREIGN PATENT DOCUMENTS

| DE | 202010010647 U1 | 11/2010 |
| GB | 2444945 A | 6/2008 |

* cited by examiner

*Primary Examiner* — Trung Q Dang

(57) ABSTRACT

In various embodiments, a light emitting diode module is provided. The light emitting diode module may include at least one light emitting diode; wherein the at least one light emitting diode is connected in parallel with at least one first capacitor; wherein the at least one light emitting diode is arranged in a first structural unit, and the at least one first capacitor is arranged in a second structural unit, wherein the first structural unit and the second structural unit are electrically coupled to one another via a first cable.

12 Claims, 3 Drawing Sheets

LED MODULE

CROSS-REFERENCE TO RELATED APPLICATION

This application claims priority to German Patent Application Serial No. 10 2012 212 024.6, which was filed Jul. 10, 2012, and is incorporated herein by reference in its entirety.

TECHNICAL FIELD

Various embodiments relate generally to an LED module including at least one LED, wherein the at least one LED is connected in parallel with at least one first capacitor.

BACKGROUND

In this context, FIG. 1 shows a conventional circuit arrangement 10 which can be coupled via an input with input connections E1, E2 to an AC supply voltage $U_N$. Downstream of the input E1, E2 is a rectifier 12. The series circuit including three light emitting diode (LED) chains LK1, LK2, LK3 and a driver apparatus 14 for the LEDs in the LED chains LK1, LK2, LK3 is coupled between the output connections GA1, GA2 of said rectifier. Each LED chain is connected in parallel with a capacitor, i.e. the LED chain LK1 with the capacitor C1, the LED chain LK2 with the capacitor C2 and the LED chain LK3 with the capacitor C3. Of course the circuit arrangement can have any desired number n of parallel circuits including LED chains and capacitors.

The capacitors serve the purpose of positively influencing the modulation response of the LEDs, in particular of reducing flicker. Furthermore, the line power factor can thus likewise be positively influenced since, in the phases in which the voltage present across the series circuit including the LED chains is lower than the required LED chain voltage, the LEDs are supplied from the capacitors. The electronic components are generally arranged on a printed circuit board, which is then accommodated in a luminaire housing.

The electronic components are generally arranged on a printed circuit board, which is then accommodated in a luminaire housing.

The abovementioned structures may, however, have the disadvantage that the housing of such a light source needs to be provided with larger dimensions owing to the capacitors which are to be connected in parallel with the LED chains and light sources with such large form factors are then no longer suitable for specific intended uses. In particular for lighting poorly accessible areas, form factors which are as low as possible are desirable. This may apply also for applications in which the light source is intended to be as movable as possible in order for example to be able to be used manually by a user for illuminating poorly accessible areas.

SUMMARY

In various embodiments, a light emitting diode module is provided. The light emitting diode module may include at least one light emitting diode; wherein the at least one light emitting diode is connected in parallel with at least one first capacitor; wherein the at least one light emitting diode is arranged in a first structural unit, and the at least one first capacitor is arranged in a second structural unit, wherein the first structural unit and the second structural unit are electrically coupled to one another via a first cable.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
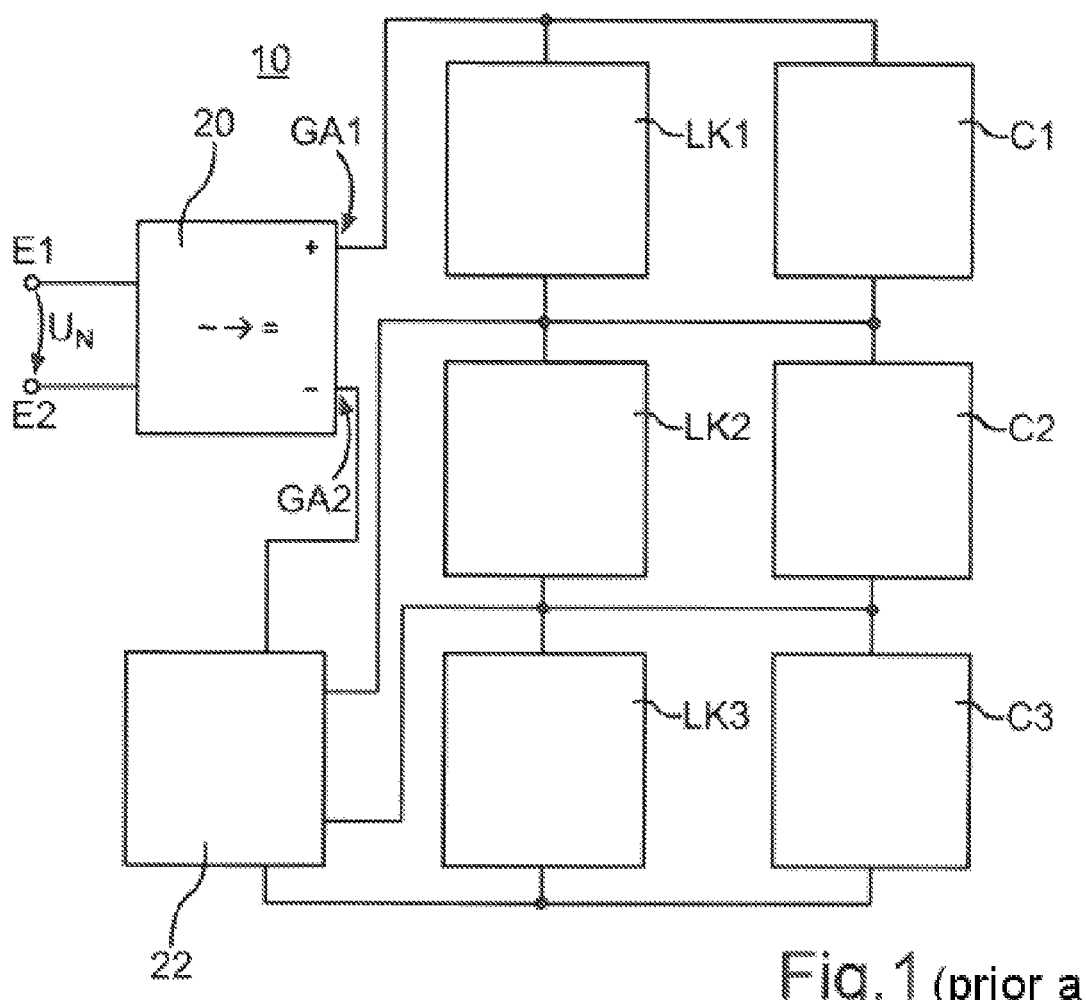
FIG. 1 shows a schematic illustration of a conventional circuit arrangement, in which respective LED chains LK1, LK2, LK3 are each connected in parallel with a capacitor C1, C2, C3.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments develop a light emitting diode (LED) module such that its use possibilities are extended.

Various embodiments are based on the knowledge that the above may be achieved in optimum fashion when the LEDs are accommodated in a first structural unit and the at least one capacitor is accommodated in a second structural unit, wherein the first structural unit and the second structural unit are coupled electrically to one another via a cable. By virtue of positioning the capacitors outside of the LED housing, the LED housing, i.e. the first structural unit, can be designed to be small and movable, wherein, nevertheless, the advantages in respect of the modulation response or the line power factor can be maintained by virtue of the capacitors arranged in the second structural unit. Furthermore, in an LED module according to the invention, the advantage is achieved that the capacitors are arranged at a distance from the heat source, i.e. the first structural housing. This results in a considerable increase in the life of the capacitors. Furthermore, a very simple installation is enabled since a fitter only needs to connect the line voltage to an LED module according to the invention. The capacitors are already coupled to the first structural unit, with the result that the coupling does not need to be performed by the fitter. Moreover, an LED module according to the invention enables an extension of the degrees of freedom in the luminaire design. In this way, further use areas are possible.

In the context of this application, possible LED modules are e.g. apparatuses which represent a combination of LEDs with further physical units within a structural unit, wherein this structural unit can have means for mechanical fastening and making electrical contact. The means for mechanical fastening and/or for making electrical contact in this case e.g. differ from those which are provided in conventional incandescent lamps and/or florescent lamps, for example in the form of T5 or T8 bases, Edison screw bases (for example E27), or bayonet bases (such as B15d), for example.

In various embodiments, the LED module includes at least one first LED chain, which includes the at least one LED, wherein the first capacitor is connected in parallel with the first LED chain. As already mentioned, the LED module may include n LED chains and at least n capacitors, wherein each LED chain is connected in parallel with at least one capacitor, wherein the n LED chains are arranged in the first structural unit, and the at least n capacitors are arranged in the second structural unit. In this way, the number of LEDs can be matched in particular to the AC supply voltage, with the result that as few thermal losses are produced as possible. As a result, such an LED module can be realized with a very high degree of efficiency. By virtue of this division of the LEDs into a plurality of chains, furthermore the voltage ranges of the capacitors to be used can be kept low. In this way, an LED module in accordance with various embodiments can be realized at particularly low cost.

In various embodiments, the LED module furthermore has a rectifier and a driver apparatus for the at least one LED, wherein the rectifier and the driver apparatus are arranged in the first structural unit. However, the LED module may further include a rectifier and a line filter, wherein the rectifier and the line filter are arranged in the second structural unit. In this way, the LED module may also be made more compact and more movable.

In various embodiments, the LED module includes an input with a first and a second input connection, wherein the first structural unit is coupled to the first and the second input connection via at least two electrical lines passed through the second structural unit. In various embodiments, the LED module includes a second cable, which is arranged between the second structural unit and the input of the LED modules.

The first cable may include a detachable coupling apparatus, which is e.g. in the form of a plug-type connection. This opens up the possibility of operating the LED module e.g. awkward application situations without the capacitors. That is to say that situations are conceivable in which the second structural unit, which is generally rigid, could be in the way. This also provides the possibility of replacing the capacitors in the event of failure. It goes without saying that the first cable can also be formed without a detachable coupling apparatus.

The second structural unit is e.g. formed in such a way that the capacitors are encapsulated by injection molding with an insulating material with a wall thickness of preferably at least 0.4 mm. This may ensure protection against electric shock. The length of the first cable may be between 1 and 20 cm, e.g. between 5 and 10 cm. The distance may be dependent on the modulation factor to be achieved or the desired performance (lumens per watt) of the LED module. The cables are formed movably in respect of the intended use.

In various embodiments, the LED module meets the Zhaga spotlight industry standard.

Figure 2:
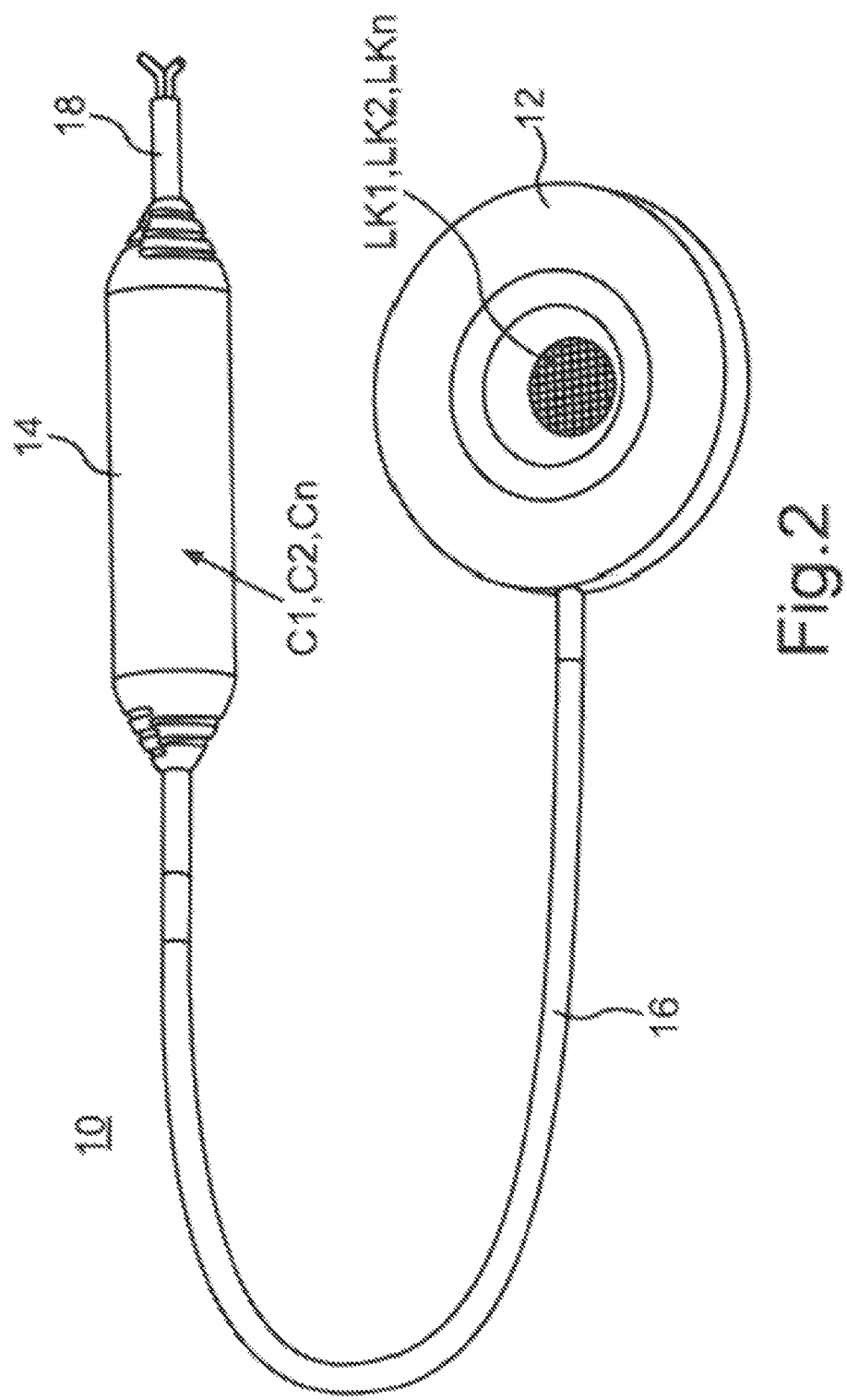
FIG. 2 shows a schematic illustration of a first exemplary embodiment of an LED module according to various embodiments.

FIG. 2 shows a schematic illustration of an embodiment of an LED module 10. This includes a large number of LED chains LK1, LK2, LKn, which are arranged in a first structural unit 12. Moreover, a rectifier 20 (not illustrated) and a driver apparatus 22 (not illustrated) for the LEDs, cf. FIG. 1, are arranged in the first structural unit 12. Depending on the intended application, further electronic components may be arranged in the LED module 10. Alternatively, these may be arranged in a second structural unit, which primarily serves the purpose, however, of accommodating capacitors $C_i$, which are connected in parallel with a respective LED chain $LK_i$. The second structural unit 14 is coupled to the first structural unit 12 via a first cable 16, which is designed to be movable. The second structural unit can be coupled, via a second, likewise moveable cable 18, directly to an AC supply voltage, for example a 230 V AC supply system. The LED module 10 meets the Zhaga spotlight standard. In various embodiments, the diameter of the first structural unit 12 is 50 mm and its height is 7 mm.

Figure 3:
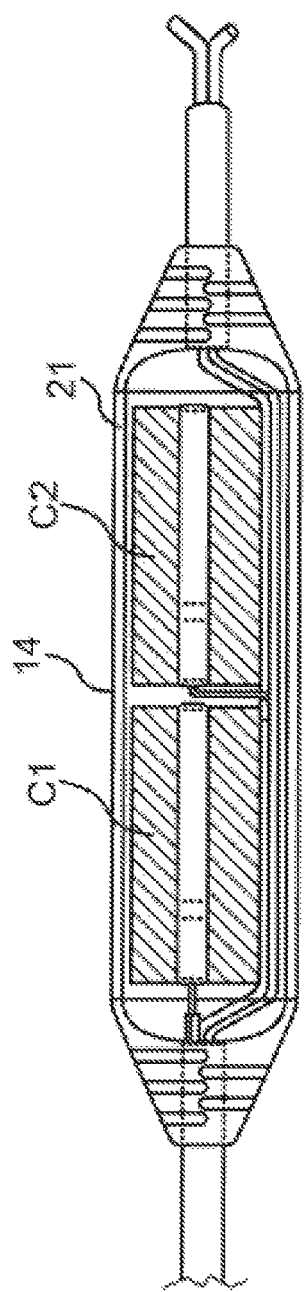
FIG. 3 shows a cross-sectional view of the second structural unit shown in FIG. 2.

FIG. 3 shows a cross-sectional view of the second structural unit 14, wherein it can be seen here that the capacitors C1, C2 are encapsulated by injection molding with plastic 21 in order to ensure protection against electric shock. The wall thickness of the plastic is e.g. at least 0.4 mm.

Figure 4:
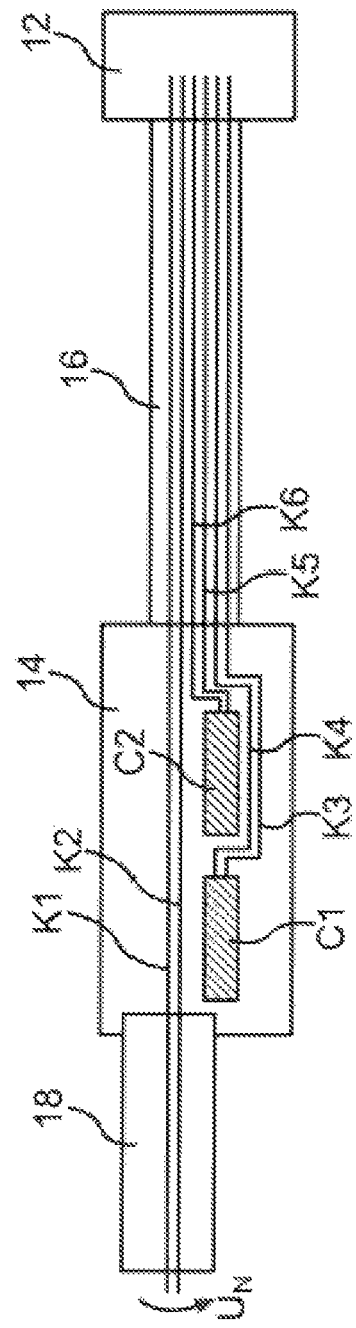
FIG. 4 a schematic cross-sectional illustration of the second structural unit shown in FIG. 2 with electrical lines illustrated.

The electrical lines which are slightly too difficult to see in FIG. 3 are illustrated more clearly in FIG. 4. It can first be seen that two lines K1, K2 are passed through the second structural unit 14, i.e. they pass from the mains connection of the LED module 10 according to various embodiments to the first structural unit 12. Each capacitor is coupled via two lines to the LED module 10, in this case the capacitor C1 via the lines K3, K4 and the capacitor C2 via the lines K5 and K6. If further capacitors need to be accommodated in the second structural unit 14, it goes without saying that further lines need to be provided in the cable 16. The length of the first cable 16 is e.g. between 10 and 200 mm, e.g. between 5 and 100 mm. The length of the second cable 18 is e.g. between 100 and 550 mm. The length of the second structural unit 14 is approximately 50 mm, and the diameter approximately 10 mm in a various embodiments.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light emitting diode module; comprising: at least one light emitting diode; wherein the at least one light emitting diode is connected in parallel with at least one first capacitor; wherein the at least one light emitting diode is arranged in a first structural unit, and the at least one first capacitor is arranged in a second structural unit, wherein the first structural unit and the second structural unit are electrically coupled to one another via a first cable,
    further comprising: a rectifier and a driver apparatus for the
        at least one light emitting diode; wherein the rectifier
        and the driver apparatus are arranged in the first structural unit.

2. The light emitting diode module of claim 1, wherein the light emitting diode module comprises at least one first light emitting diode chain, which comprises the at least one light emitting diode, wherein the first capacitor is connected in parallel with the first light emitting diode chain.

3. The light emitting diode module of claim 2, wherein the light emitting diode module comprises n light emitting diode chains and at least n capacitors, wherein each light emitting diode chain is connected in parallel with at least one capacitor, wherein the n light emitting diode chains are arranged in the first structural unit, and the at least n capacitors are arranged in the second structural unit.

4. The light emitting diode module of claim 1, further comprising: a rectifier and a line filter; wherein the rectifier and the line filter are arranged in the second structural unit.

5. The light emitting diode module of claim 1, wherein the light emitting diode module comprises an input with a first and a second input connection, wherein the first structural unit is coupled to the first and the second input connection via at least two electrical lines passed through the second structural unit.

6. The light emitting diode module of claim 1, wherein the light emitting diode module comprises a second cable, which is arranged between the second structural unit and the input of the light emitting diode module.

7. The light emitting diode module of claim 1, wherein the first cable comprises a detachable coupling apparatus, which is in particular in the form of a plug-type connection.

8. The light emitting diode module of claim 1, wherein the first cable does not comprise a detachable coupling apparatus.

9. The light emitting diode module of claim 1, wherein the second structural unit is formed in such a way that the capacitors are encapsulated by injection molding with an insulating material.

10. The light emitting diode module of claim 1, wherein the length of the first cable is between 1 and 20 cm.

11. The light emitting diode module of claim 10, wherein the length of the first cable is between 5 and 10 cm.

12. The light emitting diode module of claim 1, wherein the light emitting diode module is designed in accordance with the Zhaga spotlight industry standard.

\* \* \* \* \*